(12) United States Patent
Itahashi et al.

(10) Patent No.: US 10,020,340 B2
(45) Date of Patent: Jul. 10, 2018

(54) SOLID-STATE IMAGE SENSING ELEMENT AND IMAGING SYSTEM

(71) Applicant: CANON KABUSHIKI KAISHA, Tokyo (JP)

(72) Inventors: Masatsugu Itahashi, Yokohama (JP); Toshiaki Ono, Ebina (JP); Hidekazu Takahashi, Zama (JP); Naoki Inatani, Kawasaki (JP); Yu Maehashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 24 days.

(21) Appl. No.: 14/811,659

(22) Filed: Jul. 28, 2015

(65) Prior Publication Data

US 2016/0035780 A1 Feb. 4, 2016

(30) Foreign Application Priority Data

Jul. 31, 2014 (JP) .................................. 2014-156790

(51) Int. Cl.

| H01L 27/146 | (2006.01) |
|---|---|
| H04N 5/376 | (2011.01) |
| H01L 31/09 | (2006.01) |
| H01L 31/028 | (2006.01) |

(Continued)

(52) U.S. Cl.
CPC .... H01L 27/14643 (2013.01); H01L 27/1463 (2013.01); H01L 27/14609 (2013.01);
(Continued)

(58) Field of Classification Search
CPC ............. H01L 27/14643; H01L 31/028; H01L 27/307; H01L 27/14627; H01L 31/095;
(Continued)

(56) References Cited

U.S. PATENT DOCUMENTS 4,654,536 A * 3/1987 Saito ................. H01L 27/14603
250/208.1
4,663,535 A * 5/1987 Nakai ............... H01L 27/14667
250/226

(Continued)

FOREIGN PATENT DOCUMENTS

| CN | 101399278 A | 4/2009 |
|---|---|---|
| CN | 101800233 A | 8/2010 |
| CN | 103579381 A | 2/2014 |
| EP | 2216818 A2 | 8/2010 |
| JP | S60-093893 A | 5/1985 |
| JP | 2011-103335 A | 5/2011 |
| JP | 2011-258729 A | 12/2011 |
| JP | 2014-067948 A | 4/2014 |
| WO | 2006-023784 A2 | 3/2006 |
| WO | 2013/187001 A1 | 12/2013 |

*Primary Examiner* — Albert Cutler
(74) *Attorney, Agent, or Firm* — Canon U.S.A., Inc. IP Division (57) ABSTRACT

Each of a plurality of pixels arranged in two dimensions includes a photoelectric conversion unit including a pixel electrode, a photoelectric conversion layer provided above the pixel electrode, and a counter electrode provided so as to sandwich the photoelectric conversion layer between the counter electrode and the pixel electrode, and a microlens arranged above the photoelectric conversion unit. The plurality of pixels includes a first pixel and a plurality of second pixels. At least either the pixel electrodes of the plurality of second pixels are smaller than the pixel electrode of the first pixel or the counter electrodes of the plurality of second pixels are smaller than the counter electrode of the first pixel, and a configuration between the counter electrode and the microlens of the first pixel is the same as a configuration between the counter electrode and the microlens of each of the plurality of second pixels.

20 Claims, 10 Drawing Sheets

(51) Int. Cl.
*H01L 27/30* (2006.01)
*H04N 5/378* (2011.01)

(52) U.S. Cl.
CPC .. *H01L 27/14621* (2013.01); *H01L 27/14623* (2013.01); *H01L 27/14627* (2013.01); *H01L 27/14629* (2013.01); *H01L 27/14665* (2013.01); *H01L 27/307* (2013.01); *H01L 31/028* (2013.01); *H01L 31/095* (2013.01); *H04N 5/378* (2013.01); *H04N 5/3765* (2013.01)

(58) Field of Classification Search
CPC ......... H01L 27/14609; H01L 27/14621; H01L 27/14623; H01L 27/14629; H01L 27/1463; H01L 27/14665; H01L 27/14667; H01L 27/14669; H01L 27/1467; H01L 27/14672; H04N 5/3765; H04N 5/378
See application file for complete search history.

(56) References Cited

U.S. PATENT DOCUMENTS

| | | | |
|---|---|---|---|
| 2009/0085080 | A1 | 4/2009 | Han |
| 2010/0060769 | A1* | 3/2010 | Inuiya ............... H01L 27/14623 348/311 |
| 2010/0309357 | A1* | 12/2010 | Oike ................. H01L 27/14609 348/302 |
| 2012/0015328 | A1 | 1/2012 | Giasson |
| 2013/0015328 | A1 | 1/2013 | Goto |
| 2014/0035082 | A1 | 2/2014 | Chu |
| 2014/0077061 | A1* | 3/2014 | Lenchenkov ..... H01L 27/14623 250/208.1 |
| 2015/0195466 | A1* | 7/2015 | Takase .................. H04N 5/369 348/294 |
| 2016/0133865 | A1* | 5/2016 | Yamaguchi ....... H01L 27/14623 257/40 |

\* cited by examiner

SOLID-STATE IMAGE SENSING ELEMENT AND IMAGING SYSTEM

BACKGROUND OF THE INVENTION

Technical Field

The present disclosure relates to a solid-state image sensing element in which a photoelectric conversion layer is formed above a substrate, and an imaging system.

Description of the Related Art

Solid-state image sensing elements are known each having a configuration in which a pixel is included, the pixel including a light receiving portion in which a photoelectric conversion layer is formed above a substrate. Japanese Patent Laid-Open No. 2014-67948 describes use of an organic photoelectric conversion layer as a photoelectric conversion layer. Japanese Patent Laid-Open No. 2014-67948 further describes that a pair of pixels for phase difference detection (hereinafter referred to as "phase-difference-detection-use pixels") is provided in order to realize pupil division phase difference detection. The phase-difference-detection-use pixels have a light shielding film between a protection layer and a microlens provided above a photoelectric conversion layer, the light shielding film being used to shield a portion of incident light.

With the configuration described in Japanese Patent Laid-Open No. 2014-67948, since only the phase-difference-detection-use pixels have a light shielding film, it is difficult to uniformly form layers above a photoelectric conversion film, such as a color filter layer and a microlens. As a result, there may be the case where the sensitivity of pixels becomes different from desired characteristics since the phase-difference-detection-use pixels differ from pixels for capturing images (hereinafter referred to as "imaging-use pixels") in terms of film thickness of the color filter or shape of the microlens.

According to the present invention, the layers provided on a photoelectric conversion unit may be easily and uniformly formed.

SUMMARY

The present disclosure provides a solid-state image sensing element including a plurality of pixels arranged in two dimensions, each of the plurality of pixels including a photoelectric conversion unit including a pixel electrode, a photoelectric conversion layer provided above the pixel electrode, and a counter electrode provided so as to sandwich the photoelectric conversion layer between the counter electrode and the pixel electrode, and a microlens arranged above the photoelectric conversion unit. The plurality of pixels includes a first pixel and a plurality of second pixels, at least either the pixel electrodes of the plurality of second pixels are smaller than the pixel electrode of the first pixel or the counter electrodes of the plurality of second pixels are smaller than the counter electrode of the first pixel, and a configuration between the counter electrode and the microlens of the first pixel is the same as a configuration between the counter electrode and the microlens of each of the plurality of second pixels.

Further features of the present invention will become apparent from the following description of exemplary embodiments with reference to the attached drawings.

DESCRIPTION OF THE EMBODIMENTS

First Embodiment

Figure 1:
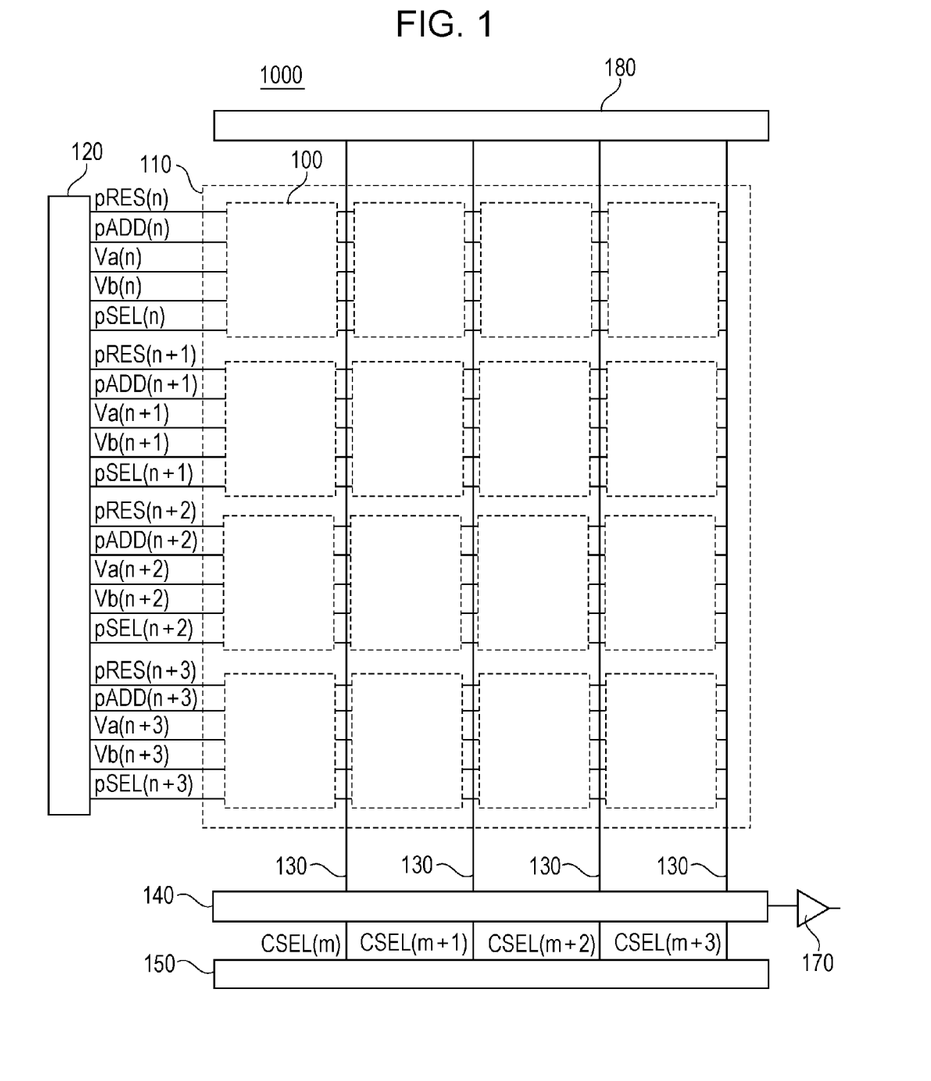
FIG. 1 is a block diagram for illustrating an example of the configuration of a solid-state image sensing element.

FIG. 1 is a block diagram for illustrating an example of the configuration of a solid-state image sensing element 1000. The solid-state image sensing element 1000 includes a pixel array 110, in which a plurality of pixels 100 are two-dimensionally arranged, a row driving circuit 120, vertical signal lines 130, a signal processing unit 140, a column-selection circuit 150, an output amplifier 170, and a constant current source 180.

FIG. 1 illustrates the case where there are pixels 100 arranged in four rows and four columns; however, the number of pixels 100 included in the pixel array 110 is not limited to this.

The row driving circuit 120 is a circuit that controls the plurality of pixels 100 per row and, for example, includes a shift register and an address decoder. In the first embodiment, the row driving circuit 120 outputs signals pRes(M), PADD(M), Va(M), Vb(M), and pSEL(M). M denotes a number representing a certain row.

A plurality of pixels 100 belonging to the same column are connected to a vertical signal line 130, which is common to the pixels 100. Signals output from the pixels 100 are transferred to the signal processing unit 140 via the vertical signal line 130.

The signal processing unit 140 includes a plurality of column signal processing units provided so as to correspond to respective columns of the pixel array 110. Each column signal processing unit may include a CDS circuit for reducing noise, an amplifier for amplifying a signal, a sample-and-hold circuit for holding a signal, and the like. The column signal processing unit outputs a signal upon being selected by a signal CSEL(N) supplied from the column-selection circuit 150, and the output signal is transferred to the output amplifier 170. N denotes a number representing a certain column.

Figure 2:
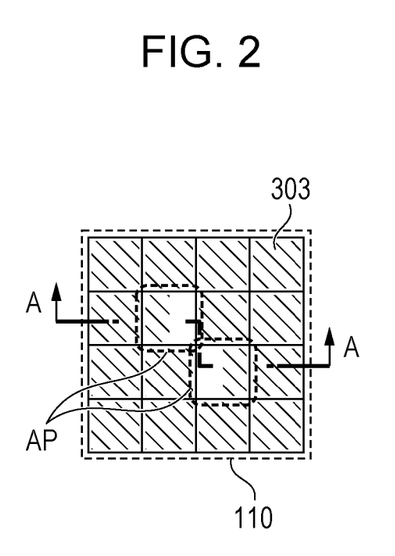
FIG. 2 is a diagram for illustrating an example of a plan-view configuration of a pixel array.

In the first embodiment, the plurality of pixels 100 include imaging-use pixels IP serving as first pixels and also phase-difference-detection-use pixels AP serving as second pixels. FIG. 2 is a diagram for illustrating an example of a plan-view configuration of the pixel array 110 according to the first embodiment. Here illustrates the case where two pixels are phase-difference-detection-use pixels AP and the other pixels are imaging-use pixels IP. Each of the pixels includes a pixel electrode, which will be described later, and the phase-difference-detection-use pixels AP have smaller pixel electrodes than the imaging-use pixels IP.

Figure 3:
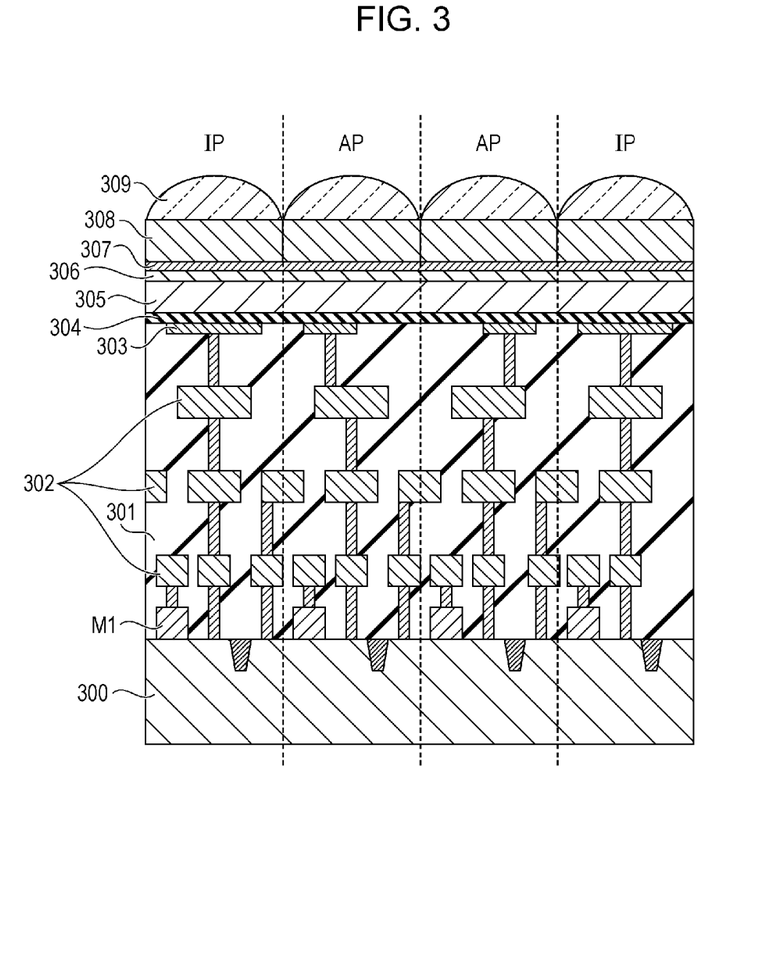
FIG. 3 is a diagram for illustrating an example of a cross section configuration of the pixel array.

FIG. 3 illustrates an example of a configuration taken along line A-A illustrated in FIG. 2. The pixel array 110 includes a silicon substrate (a Si substrate) 300, a bottom insulating layer 301 provided on the Si substrate 300, and a wiring layer 302 arranged in the bottom insulating layer 301. A MOS transistor is formed on the Si substrate 300, and a wiring line for supplying power to the MOS transistor and a wiring line for transferring a signal to control the MOS transistor are also included in the wiring layer 302. Some of the wiring lines included in the wiring layer 302 connect a signal readout circuit, not illustrated, formed on the Si substrate 300 to pixel electrodes 303. As illustrated also in FIG. 2, the pixel electrodes 303 of the phase-difference-detection-use pixels AP are smaller than the pixel electrodes 303 of the imaging-use pixels IP. An interlayer insulating layer 304, a photoelectric conversion layer 305, a blocking layer 306, a counter electrode 307, a color filter layer 308, and a microlens layer 309 having a plurality of microlenses are provided on the pixel electrodes 303. In the first embodiment, the counter electrode 307 is provided such that the counter electrode 307 is common to a plurality of pixels. A Bayer pattern may be used as a color filter arrangement of the color filter layer 308. For the phase-difference-detection-use pixels AP, not R (red) and B (blue) filters but G (green) filters may be used to obtain luminance information. Thus, the pixels to which G filters are arranged in the Bayer pattern may be phase-difference-detection-use pixels AP. In addition, R and B filters are replaced with G filters for some of the pixels located at positions to which R and B filters are arranged in the Bayer pattern, and such pixels may be phase-difference-detection-use pixels AP. In addition, any color filter among R (red), G, and B (blue) filters may be arranged for each imaging-use pixel IP, and clear filters may be arranged only for phase-difference-detection-use pixels AP.

The interlayer insulating layer 304 provided on the pixel electrodes 303 is a layer for preventing electrons and holes from flowing between the pixel electrodes 303 and the photoelectric conversion layer 305, and is formed using, for example, hydrogenated amorphous silicon nitride (a-SiN:H). The thickness of the interlayer insulating layer 304 is set to a certain value that is enough to prevent electrons and holes from flowing through the interlayer insulating layer 304 by a tunneling effect. Specifically, the thickness is preferably 50 nm or greater.

The photoelectric conversion layer 305, which is provided above the pixel electrodes 303 with the interlayer insulating layer 304 interposed therebetween, is a layer with the ability to perform photoelectric conversion in which electron-hole pairs are generated upon reception of incident light. As a material composing the photoelectric conversion layer 305, intrinsic hydrogenated amorphous silicon (a-Si:H), a compound semiconductor, or an organic semiconductor may be used. Examples of such a compound semiconductor include III-VI compound semiconductors such as BN, GaAs, GaP, AlSb, and GaAlAsP, and II-IV compound semiconductors such as CdSe, ZnS, and HdTe. In addition, examples of such an organic semiconductor include phthalocyanine-based materials and naphthalocyanine-based materials such as a fullerene, coumarin 6 (C6), Rhodamine 6G (R6G), quinacridon, and zinc phthalocyanine (ZnPc).

Furthermore, a quantum dot film using such a compound semiconductor described above as a raw material may be used for the photoelectric conversion layer 305. An amorphous silicon film, an organic semiconductor film, and a quantum dot film may be used since thin film formation is easy.

Intrinsic semiconductors are superior in that a wide depletion layer width may be realized by using such an intrinsic semiconductor for the photoelectric conversion layer 305 since intrinsic semiconductors have low carrier concentrations; however, an n-type or p-type semiconductor may also be used.

The blocking layer 306 is provided on the photoelectric conversion layer 305. The blocking layer 306 according to the first embodiment is a layer having a function through which holes are prevented from being injected from the counter electrode 307 to the photoelectric conversion layer 305 and, for example, N+ type hydrogenated amorphous silicon is used. In this example, N+ type a-SiH is used to prevent holes from being injected. In order to prevent electrons from being injected, P+ type a-SiH is used. The blocking layer 306 is expected to prevent either one of an electron and a hole, which is a conductive carrier, from being injected from the counter electrode 307 to the photoelectric conversion layer 305. A P-type or N-type semiconductor, which is a semiconductor material used for the photoelectric conversion layer 305, may be used for the blocking layer 306. In this case, the impurity concentration of the semiconductor used for the blocking layer 306 is designed to be higher than the impurity concentration of the semiconductor used for the photoelectric conversion layer 305.

The counter electrode 307, which is provided above the photoelectric conversion layer 305 with the blocking layer 306 interposed therebetween, is formed using a material that allows light entering through the microlens layer 309 and the color filter layer 308 to flow therethrough and enter the photoelectric conversion layer 305. Specifically, a compound, an oxide, or the like including indium and tin such as ITO is used.

A light transparent layer may further be provided between the counter electrode 307 and the microlens layer 309. The microlens layer 309, the color filter layer 308, and the light transparent layer may be designed such that the focal point of the microlens layer 309 is at the photoelectric conversion layer 305. The light transparent layer may be formed using an inorganic substance such as Si oxide or silicon nitride, or may also be formed using an organic substance.

Figure 4:
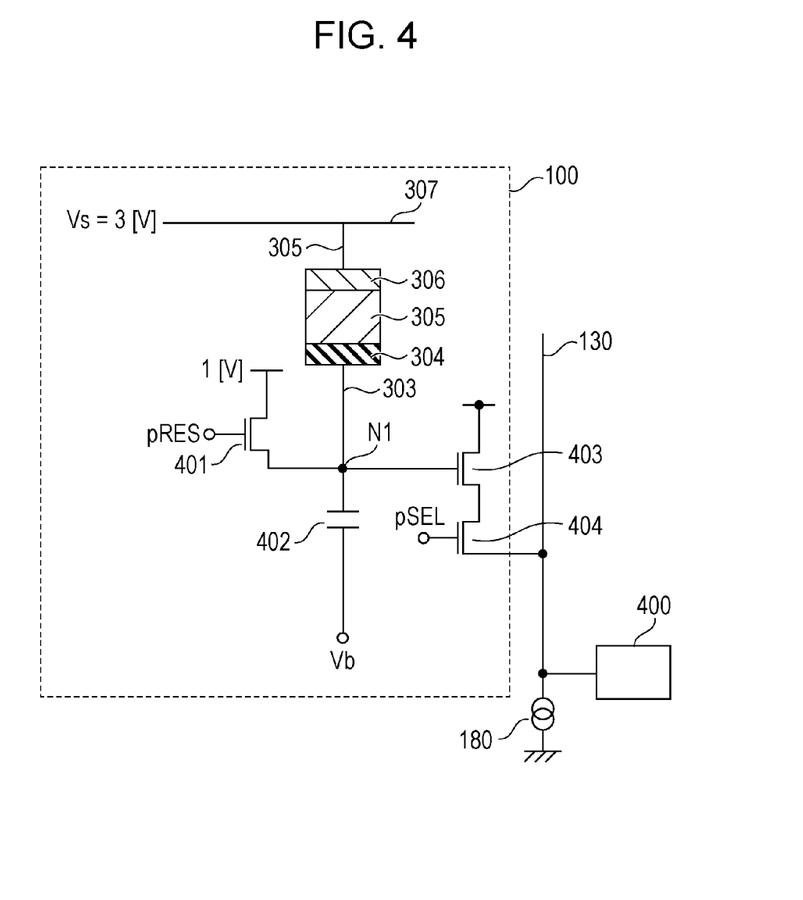
FIG. 4 is an equivalent circuit diagram for illustrating an example of the configuration of a pixel.

FIG. 4 is an equivalent circuit diagram of a pixel 100 according to the first embodiment. In an equivalent circuit diagram, the imaging-use pixels IP and the phase-difference-detection-use pixels AP have the same configuration. The pixel 100 includes a photoelectric conversion unit including the blocking layer 306, the photoelectric conversion layer 305, and the interlayer insulating layer 304, and a signal readout circuit 400.

The signal readout circuit 400 includes a reset transistor 401, a driving capacitor 402, an amplifying transistor 403, and a selection transistor 404. A reset voltage is applied to one of main nodes of the reset transistor 401, and the other main node is connected to a control node of the amplifying transistor 403. This node is denoted as a node N1. A reset signal pRES is supplied to a control node of the reset transistor 401. A bias voltage Vb is applied to one of nodes of the driving capacitor 402 and the other node is connected to the node N1. The photoelectric conversion unit is connected to the node N1 via the pixel electrode 303. A fixed voltage is applied to one of main nodes of the amplifying transistor 403 and the other main node is connected to the vertical signal line 130 via the selection transistor 404. A pixel selection signal pSEL is supplied to a control node of the selection transistor 404. When the selection transistor 404 is switched on, the amplifying transistor 403 serving as an in-pixel amplifier operates together with the constant current source 180 as a source follower circuit, and a voltage output corresponding to the electric potential of the node N1 is input, as a pixel signal from the pixel 100, to the signal processing unit 140. The node N1 is an input portion of the in-pixel amplifier. The in-pixel amplifier is not limited to a source follower circuit, and may also be a common-source amplification circuit or may also be an inverter or a differential amplifier composed of a plurality of transistors.

Next, an operation for reading a signal out from a pixel 100 according to the first embodiment will be described. FIG. 5 is a potential diagram of the photoelectric conversion unit for describing a signal readout operation. The lower the position in FIG. 5, the lower the potential with respect to electrons. In FIG. 5, the potentials of regions including the counter electrode 307, the photoelectric conversion layer 305, the interlayer insulating layer 304, and the pixel electrode 303 (corresponding to the node N1) in this order starting from the left are illustrated. Here, for brevity's sake, the blocking layer 306 is omitted. In FIG. 5, black circles represent electrons and white circles represent holes.

In the first embodiment, suppose that the reset voltage is 1 [V] and a bias voltage Vs for driving the photoelectric conversion unit is 3 [V], the bias voltage Vs being applied to a top electrode. Furthermore, the bias voltage Vb may be switched between 5 [V] and 0 [V] by a control circuit, which is not illustrated.

A readout operation of the pixel 100 is realized by performing the following a) to f) operations.
a) Pre-accumulation Reset
b) Photocarrier Accumulation
c) Post-accumulation Reset
d) N Signal Readout
e) Charge Transfer
f) S Signal Readout In the following, the steps described above will be described in detail.
a) Pre-Accumulation Reset In a state in which the bias voltage Vb is set to 0 [V], the node N1 is reset to 1 [V] by causing the reset transistor 401 to enter an on state. Thereafter, when the reset transistor 401 is caused to enter an off state, kTC noise (kTC1) is generated by an operation of the reset transistor 401. As a result, the electric potential of the node N1, that is, the pixel electrode 303 becomes 1 [V]+kTC1 (FIG. 5A).
b) Photocarrier Accumulation In a state in which light enters the photoelectric conversion layer 305, when pre-accumulation reset is completed, a photocarrier accumulation operation is started. During photocarrier accumulation, the bias voltage Vb is maintained at 0 [V]. Thus, the electric potential of the pixel electrode 303 becomes a negative electric potential with respect to that of the counter electrode 307, to which a voltage of 3 [V] is applied. As a result, electrons in the photoelectric conversion layer 305 are guided toward the counter electrode 307 and discharged from the counter electrode 307 via the blocking layer 306. In contrast, holes are guided toward the pixel electrode 303. Note that since the blocking layer 306 is present, injection is not performed from the counter electrode 307 to the photoelectric conversion layer 305 (FIG. 5B)).

Figure 5A:
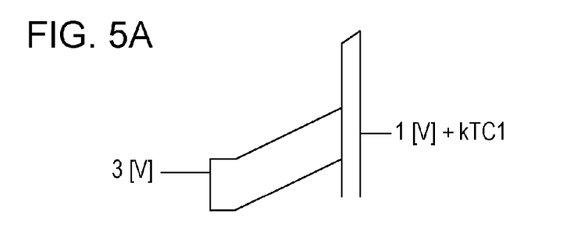
FIGS. 5A to 5F are potential diagrams of a photoelectric conversion unit for describing a signal readout operation.
Figure 5B:
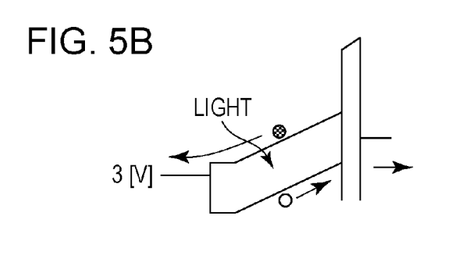
Figure 5C:
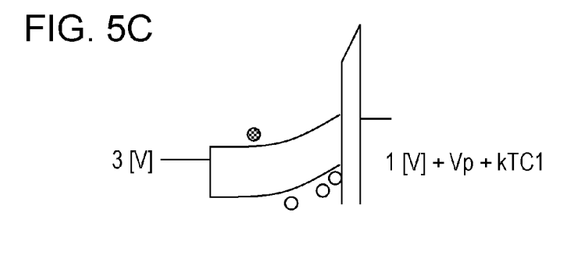
Figure 5D:
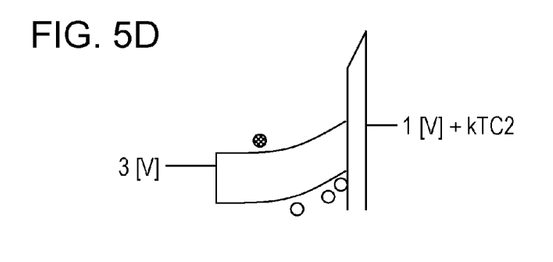

When the photoelectric conversion layer 305 absorbs incident light, electron-hole pairs are generated in accordance with the light intensity of the incident light. The generated electrons are discharged from the counter electrode 307 and the generated holes move inside the photoelectric conversion layer 305 and reach the interface to the interlayer insulating layer 304. However, since holes are unable to move into the interlayer insulating layer 304, the holes are accumulated inside the photoelectric conversion layer 305 (FIG. 5C). The holes accumulated in this manner are used as signal electric charge based on the incident light. Due to the holes accumulated inside the photoelectric conversion layer 305, the electric potential of the node N1 is increased by Vp and the electric potential of the node N1 becomes 1 [V]+kTC1+Vp1.
c) Post-Accumulation Reset The node N1 is reset to 1 [V] by temporarily switching the reset transistor 401 to on. Since noise (kTC2) is generated by an operation of the reset transistor 401, the electric potential of the node N1 becomes 1 [V]+kTC2. The noise kTC1 generated by the pre-accumulation reset and the noise kTC2 generated by the post-accumulation reset have no correlation therebetween and are so-called random noise components.

Note that even when the node N1 is reset by the reset transistor 401, the holes accumulated in the photoelectric conversion layer 305 stay in the photoelectric conversion layer 305 (FIG. 5D).
d) N Signal Readout The selection transistor 404 is switched on, and a signal corresponding to the electric potential of the node N1 at this time is output to the vertical signal line 130. The output signal is held by, for example, the column signal processing unit.
e) Charge Transfer The bias voltage Vb is changed from 0 [V] to 5 [V]. As a result, the electric potential of the node N1 changes. The amount of change in electric potential is determined by the ratio of the capacitance of the photoelectric conversion unit to the capacitance of the driving capacitor 402. Suppose that the capacitance of the photoelectric conversion unit is denoted as C1, the capacitance of the driving capacitor 402 is denoted as C2, and the amount of positive change in bias voltage Vb is denoted as $\Delta Vb$. In this case, the amount of change $\Delta VN1$ in electric potential of the node N1 is expressed as in the following expression.

$$\Delta VN1 = \Delta Vb \times C1/(C1+C2) \quad (1)$$

In the first embodiment, if the capacitance C1 of the driving capacitor 402 is four times greater than the capacitance C2 of the photoelectric conversion unit, the amount of change in electric potential of the node N1 becomes 4 [V] when the bias voltage Vb is changed to 5 [V].

Figure 5E:
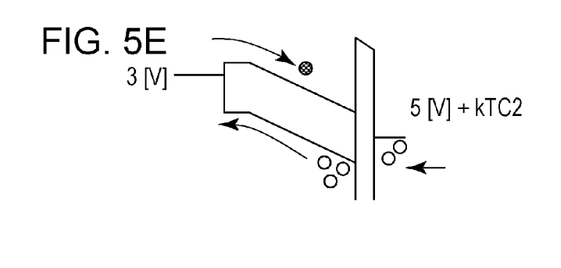
Figure 5F:
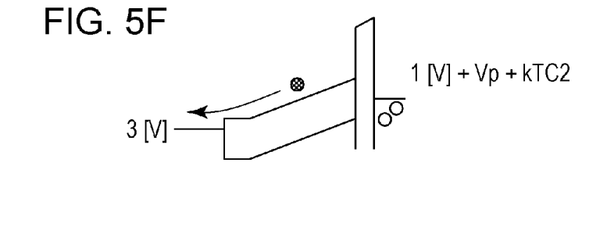

When the electric potential of the node N1 increases by 4 [V] and becomes 5 [V]+kTC2, the electric potential of the node N1 becomes positive with respect to the electric potential of the counter electrode 307. As a result, the gradient of the potential in the photoelectric conversion layer 305 is inverted (FIG. 5E). As a result, electrons are injected from the counter electrode 307 to the photoelectric conversion layer 305 via the blocking layer 306. In addition, the holes accumulated inside the photoelectric conversion layer 305 are guided toward the counter electrode 307, and recombine with electrons and disappear in the blocking layer 306. As a result, all the holes accumulated inside the photoelectric conversion layer 305 are discharged from the photoelectric conversion layer 305. That is, a complete transfer is achieved by full depletion of the photoelectric conversion layer 305 (FIG. 5F).

Next, if the bias voltage Vb is changed to 0 [V] again, the electric potential of the node N1 becomes negative with respect to the electric potential of the counter electrode 307.

Thus, the electrons injected to the photoelectric conversion layer 305 when the bias voltage Vb is 5 [V] are discharged from the photoelectric conversion layer 305 via the blocking layer 306. Ideally, the number of electrons discharged in this manner is equal to the number of electrons injected to the photoelectric conversion layer 305. Signal readout is thus not affected. When the bias voltage Vb is changed to 0 [V], the electric potential of the node N1 tries to return to 1 [V]+kTC2. However, since the blocking layer 306 is provided between the counter electrode 307 and the photoelectric conversion layer 305, holes are not injected to the photoelectric conversion layer 305. Thus, a signal based on the holes accumulated by a photocarrier accumulation operation in the photoelectric conversion layer 305 remains as an optical signal component Vp. Consequently, the electric potential of the node N1 becomes 1 [V]+kTC2+Vp.

f) S Signal Readout

The selection transistor 404 is switched on, and a signal corresponding to the electric potential of the node N1 at this time is output to the vertical signal line 130. The output signal is held by, for example, the column signal processing unit. Since kTC2, which is a noise component, is canceled by performing differential processing on the signal obtained in this step and the signal obtained by performing the N signal readout of d), a signal corresponding to the optical signal component Vp is thus obtained.

The selection transistor 404 may also be maintained in the on state after the N signal readout.

By performing the above-described operation, a pixel signal may be read out.

As understood from the above-described description, the holes generated in the region sandwiched between the pixel electrode 303 and the counter electrode 307 in the photoelectric conversion layer 305 are used as signal electric charge. Thus, each of the phase-difference-detection-use pixels AP, the pixel electrodes 303 of which are smaller than the pixel electrodes 303 of the imaging-use pixels IP, obtains only a signal corresponding to light entering a region smaller than such an imaging-use pixel IP. As illustrated in FIG. 2, the two phase-difference-detection-use pixels AP are configured such that one of the phase-difference-detection-use pixels AP has the pixel electrode 303 only in its left side portion and the other one of the phase-difference-detection-use pixels AP has the pixel electrode 303 only in its right side portion. As a result, phase difference detection may be realized using signals obtained from these two phase-difference-detection-use pixels AP. In addition to the configuration illustrated in FIG. 2, one of the pixel electrodes 303 may also be provided only in a top side portion of one of the phase-difference-detection-use pixels AP and the other pixel electrode 303 may also be provided only in a bottom side portion of the other one of the phase-difference-detection-use pixels AP. That is, for the two phase-difference-detection-use pixels, the pixel electrodes 303 have only to be provided such that the pixel electrodes 303 are arranged symmetrically to each other.

Furthermore, in the first embodiment, the imaging-use pixels IP and the phase-difference-detection-use pixels AP have the same configuration between the counter electrode 307 and the microlenses. Here, two pixels having the same configuration refer to that the two pixels have the same layer structure. For example, in the case where one of the pixels has a layer that the other one of the pixels does not have, the configurations of the pixels are different. For example, in the configuration illustrated in FIG. 2 of Japanese Patent Laid-Open No. 2014-67948, there are phase-difference-detection-use pixels having a light shielding film 19 provided above a counter electrode layer 16 and pixels that do not have the light shielding film 19 above the counter electrode layer 16. Thus, the configurations of the pixels are different.

According to the first embodiment, the imaging-use pixels IP and the phase-difference-detection-use pixels AP have the same configuration between the counter electrode 307 and the microlenses. As a result, the color filter layer 308 and the microlens layer 309 may be easily and uniformly formed. Consequently, it may be prevented that the sensitivity of the imaging-use pixels IP becomes different from desired characteristics.

Second Embodiment

Figure 6:
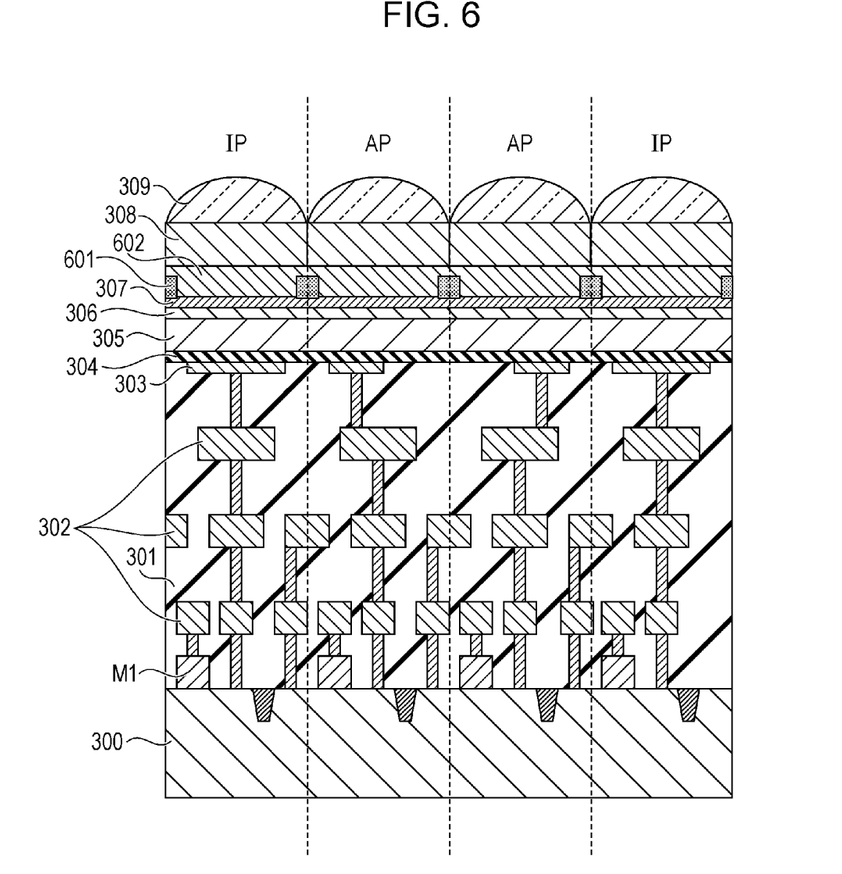
FIG. 6 is a diagram for illustrating an example of a cross section configuration of the pixel array.

Another example of the configuration of the pixel array 110 will be described. FIG. 6 is a cross section illustrating the configuration of the pixels taken along line A-A of FIG. 2.

The configuration illustrated in FIG. 6 differs from that illustrated in FIG. 3 in that light shielding films 601 and a protection layer 602 are provided between the counter electrode 307 and the color filter layer 308.

Each of the light shielding films 601 is provided between adjacent pixels corresponding to the light shielding film 601. The amount of light entering adjacent pixels may be reduced by providing the light shielding films 601 such that each light shielding film 601 lies astride the boundary between two adjacent pixels corresponding to the light shielding film 601. As a result, the degree of color mixture is reduced for the imaging-use pixels IP, and the performance of phase difference detection is improved for the phase-difference-detection-use pixels AP.

Each of the light shielding films 601 may be a metal film having one layer or may also be a metal film having a layered structure composed of a plurality of layers. Some specific examples may be a W single layer, a WSi single layer, an AlCu single layer, a W/TiN multilayer, an AlCu/TiN multilayer, and an AlCu/TiN/Ti multilayer. There may be provided, between the light shielding films 601, a film made of a material the same as that of the protection layer 602 or a film made of a material different from that of the protection layer 602.

The light shielding films 601 may contact the counter electrode 307 or may be separated from the counter electrode 307 by an insulating member. What is important is that the phase-difference-detection-use pixels AP and the imaging-use pixels IP have the light shielding films 601 having the same configuration. That is, the light shielding films 601 of the phase-difference-detection-use pixels AP have the same film thickness as the light shielding films 601 of the imaging-use pixels IP.

The protection layer 602 is a layer made of an insulating film such as a SiO film or a SiN film and is provided such that the protection layer 602 covers the light shielding films 601. Unevenness caused by providing the light shielding films 601 may be smoothed by providing the protection layer 602. Thus, the protection layer 602 is effective in improving optical characteristics. Before formation of a color filter on the protection layer 602, planarization processing may be performed on the protection layer 602.

Also in the case where the protection layer 602 is provided, the protection layer 602 of the phase-difference-detection-use pixels AP and the protection layer 602 of the imaging-use pixels IP have the same configuration. That is, the protection layer 602 of the phase-difference-detection-use pixels AP has the same film thickness as the protection layer 602 of the imaging-use pixels IP.

FIG. 6 illustrates, as an example, the case where the protection layer 602 is included; however, the protection layer 602 does not have to be included.

According to the second embodiment, the effects similar to those of the first embodiment are obtained and the degree of color mixture may be reduced and the performance of phase difference detection may be improved by providing each of the light shielding films 601 between adjacent pixels corresponding to the light shielding film 601. Furthermore, optical characteristics may be improved by providing the protection layer 602.

Third Embodiment

Figure 7:
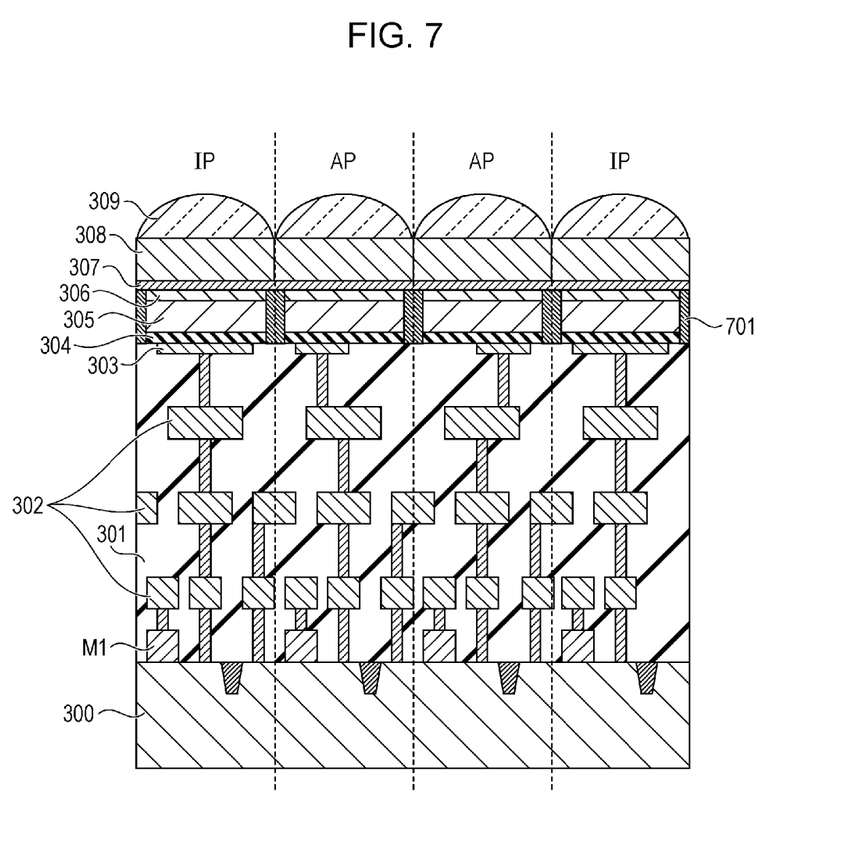
FIG. 7 is a diagram for illustrating an example of a cross section configuration of the pixel array.

Another example of the configuration of the pixel array 110 will be described. FIG. 7 is a cross section illustrating the configuration of the pixels taken along line A-A of FIG. 2.

In FIG. 3, the photoelectric conversion layer 305 is formed as a continuous layer for a plurality of pixels. The configuration illustrated in FIG. 7 differs from that illustrated in FIG. 3 in that photoelectric conversion layer separation units 701 are included, each of which is provided between two adjacent pixels corresponding to the photoelectric conversion layer separation unit 701 so as to divide the photoelectric conversion layer 305.

In the case where each of the photoelectric conversion layer separation units 701 is formed such that the photoelectric conversion layer separation unit 701 lies astride the boundary between the two adjacent pixels corresponding to the photoelectric conversion layer separation unit 701, photoelectric conversion is not performed near the boundary between the pixels. Thus, the degree of color mixture may be reduced and the performance of phase difference detection may be improved.

The photoelectric conversion layer separation units 701 may be made of an insulating member such as a SiO film or a SiN film, or may also be made of a light shielding member such as a W single layer, a WSi single layer, an AlCu single layer, a W/TiN multilayer, an AlCu/TiN multilayer, or an AlCu/TiN/Ti multilayer. In the case where a light shielding member is used, the photoelectric conversion layer separation units 701 may contact either the pixel electrodes 303 or the counter electrode 307 but may not contact both the pixel electrodes 303 and the counter electrode 307. By using the photoelectric conversion layer separation units 701 made of a light shielding member, the degree of color mixture may further be reduced and the performance of phase difference detection may further be improved.

According to the third embodiment, the effects similar to those of the first embodiment are obtained and also the degree of color mixture may be reduced and the performance of phase difference detection may be improved by providing the photoelectric conversion layer separation units 701. Furthermore, by using the photoelectric conversion layer separation units 701 made of a light shielding member, the degree of color mixture may further be reduced and the performance of phase difference detection may further be improved.

Fourth Embodiment

Figure 8:
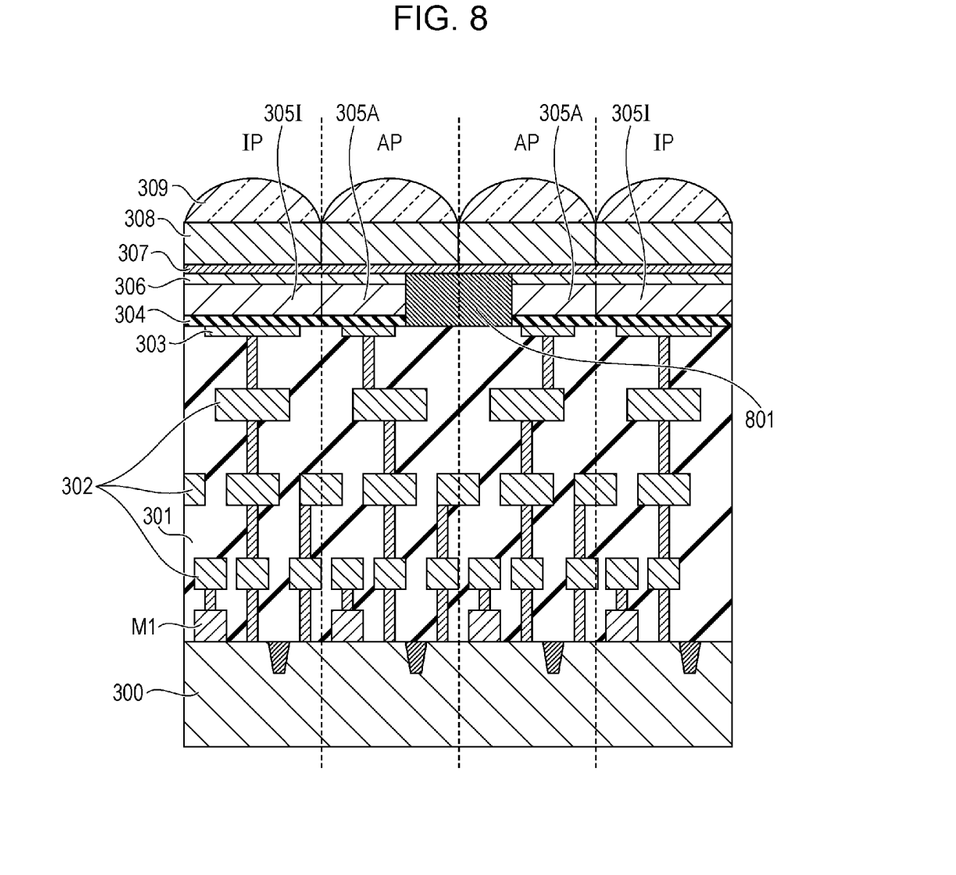
FIG. 8 is a diagram for illustrating an example of a cross section configuration of the pixel array.

Another example of the configuration of the pixel array 110 will be described. FIG. 8 is a cross section illustrating the configuration of the pixels taken along line A-A of FIG. 2.

In FIG. 3, the photoelectric conversion layer 305 is formed as a continuous layer for a plurality of pixels. The configuration illustrated in FIG. 8 differs from that illustrated in FIG. 3 in that photoelectric conversion layers 305A of the phase-difference-detection-use pixels AP are smaller than photoelectric conversion layers 305I of the imaging-use pixels IP.

As described above, in the photoelectric conversion unit, the charge generated in the region sandwiched between the pixel electrode 303 and the counter electrode 307 in the photoelectric conversion layer 305 is used as signal electric charge. However, in the photoelectric conversion layer 305, photoelectric conversion is performed also in a region that is not sandwiched between the pixel electrode 303 and the counter electrode 307. Thus, the charge generated in such a region may move to the region sandwiched between the pixel electrode 303 and the counter electrode 307. As a result, pixel signals read out from the phase-difference-detection-use pixels AP may include unnecessary signal components. Thus, in the fourth embodiment, in the phase-difference-detection-use pixels AP, a photoelectric conversion layer portion that does not correspond to the pixel electrodes 303 and regions near the pixel electrodes 303 is eliminated and a photoelectric conversion layer separation unit 801 is provided. As a result, photoelectric conversion is not performed in the region that is not sandwiched between the pixel electrode 303 and the counter electrode 307. Consequently, the degree of color mixture may be reduced and the performance of phase difference detection may be improved.

The photoelectric conversion layer separation unit 801 may be made of an insulating member such as a SiO film or a SiN film, or may also be made of a light shielding member such as a W single layer, a WSi single layer, an AlCu single layer, a W/TiN multilayer, an AlCu/TiN multilayer, or an AlCu/TiN/Ti multilayer. In the case where a light shielding member is used, the photoelectric conversion layer separation unit 801 may contact either the pixel electrodes 303 or the counter electrode 307 but may not contact both the pixel electrodes 303 and the counter electrode 307. By using the photoelectric conversion layer separation unit 801 made of a light shielding member, the degree of color mixture may further be reduced and the performance of phase difference detection may further be improved.

According to the fourth embodiment, the effects similar to those of the first embodiment are obtained and the degree of color mixture may be reduced and the performance of phase difference detection may be improved by providing the photoelectric conversion layer separation unit 801. Furthermore, by using the photoelectric conversion layer separation unit 801 made of a light shielding member, the degree of color mixture may further be reduced and the performance of phase difference detection may further be improved.

In addition, in the fourth embodiment, the photoelectric conversion layer 305I of each imaging-use pixel IP and the photoelectric conversion layer 305A of the phase-difference-detection-use pixel AP corresponding to the imaging-use pixel IP are integrally formed. However, as illustrated in the third embodiment, the photoelectric conversion layer separation unit 801 may also be provided between the imaging-use pixel IP and the phase-difference-detection-use pixel AP. As a result, the degree of color mixture may further be reduced and the performance of phase difference detection may further be improved.

Fifth Embodiment

Figure 9:
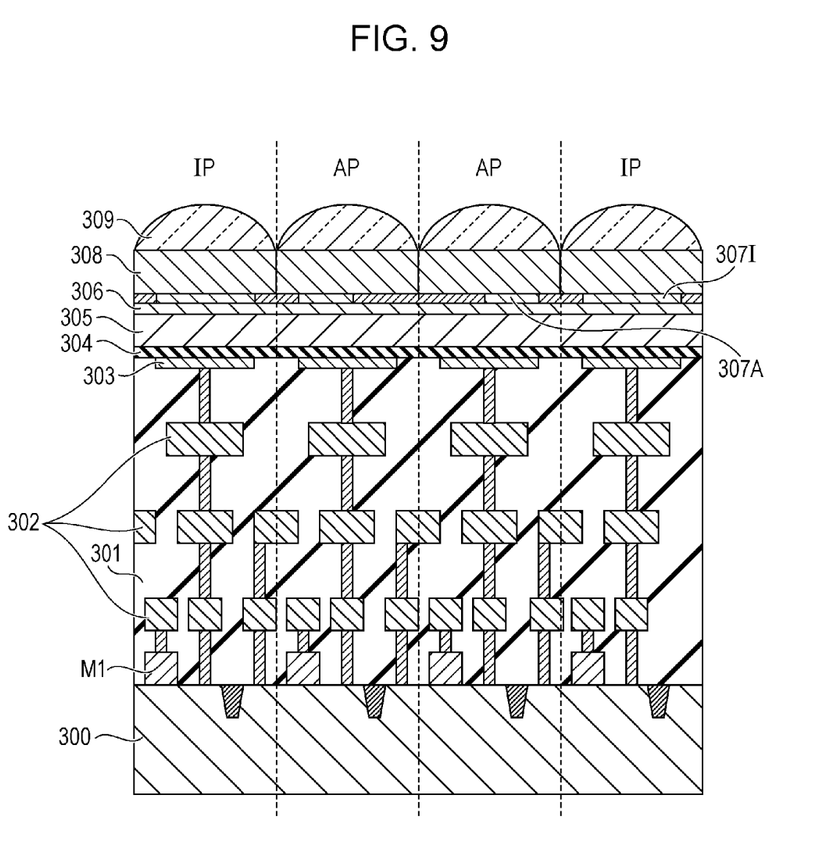
FIG. 9 is a diagram for illustrating an example of a cross section configuration of the pixel array.

Another example of the configuration of the pixel array 110 will be described. FIG. 9 is a cross section illustrating the configuration of the pixels taken along line A-A of FIG. 2.

The configuration illustrated in FIG. 9 differs from that illustrated in FIG. 3 in that the counter electrodes 307 of the phase-difference-detection-use pixels AP are smaller than the counter electrodes 307 of the imaging-use pixels IP and in that the pixel electrodes 303 of the imaging-use pixels IP are the same size as the pixel electrodes 303 of the phase-difference-detection-use pixels AP.

In the fifth embodiment, counter electrodes 307A of the phase-difference-detection-use pixels AP are smaller than counter electrodes 307I of the imaging-use pixels IP. As a result, portions sandwiched between the pixel electrodes 303 and the counter electrodes 307 in the photoelectric conversion layer 305 in the phase-difference-detection-use pixels AP are smaller than such portions in the imaging-use pixels IP. Similarly to the pixel electrodes 303 illustrated in FIG. 2, the two phase-difference-detection-use pixels AP are configured such that one of the phase-difference-detection-use pixels AP has the counter electrode 307 only in its left side portion and the other one of the phase-difference-detection-use pixels AP has the counter electrode 307 only in its right side portion. Thus, phase difference detection may be realized using signals obtained from these phase-difference-detection-use pixels AP.

Also in the fifth embodiment, a signal may be read out by the same operation as in the first embodiment.

FIG. 9 has illustrated the case where the pixel electrodes 303 of the imaging-use pixels IP are the same size as the pixel electrodes 303 of the phase-difference-detection-use pixels AP. However, similarly to as in FIG. 3, the pixel electrodes 303 of the phase-difference-detection-use pixels AP may be made smaller than the pixel electrodes 303 of the imaging-use pixels IP. For the imaging-use pixels IP and the phase-difference-detection-use pixels AP, at least either the pixel electrodes 303 of the phase-difference-detection-use pixels AP have only to be smaller than the pixel electrodes 303 of the imaging-use pixels IP or the counter electrodes 307 of the phase-difference-detection-use pixels AP have only to be smaller than the counter electrodes 307 of the imaging-use pixels IP.

Also in the fifth embodiment, the imaging-use pixels IP and the phase-difference-detection-use pixels AP have the same configuration between the counter electrodes 307 and the microlenses. As a result, the color filter layer 308 and the microlens layer 309 may be easily and uniformly formed. Consequently, it may be prevented that the sensitivity of the imaging-use pixels IP becomes different from desired characteristics.

Sixth Embodiment

Figure 10:
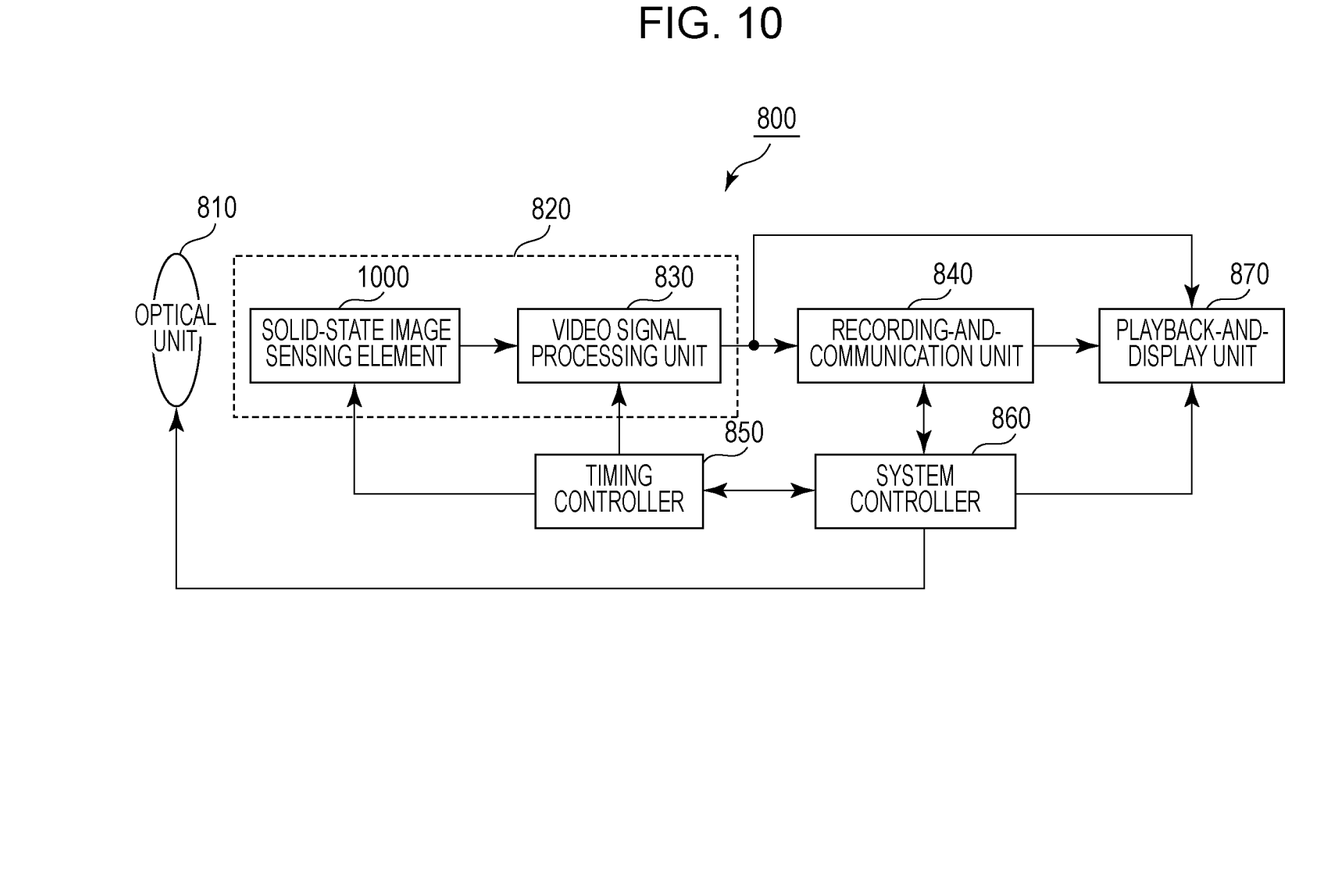
FIG. 10 is a block diagram for illustrating an example of the configuration of an imaging system.

FIG. 10 is a diagram illustrating an example of the configuration of an imaging system. An imaging system 800 includes, for example, an optical unit 810, the solid-state image sensing element 1000, a video signal processing unit 830, a recording-and-communication unit 840, a timing controller 850, a system controller 860, and a playback-and-display unit 870. An image pickup device 820 includes the solid-state image sensing element 1000 and the video signal processing unit 830. As the solid-state image sensing element 1000, the solid-state image sensing element described in the above-described embodiments is used.

The optical unit 810 is an optical system such as a lens, and causes image formation to be performed onto a pixel unit 10 of the solid-state image sensing element 1000 using light from an object, in the pixel unit 10 a plurality of pixels being arranged two-dimensionally, and forms an image of the object. The solid-state image sensing element 1000 outputs a signal corresponding to the light with which image formation has been performed onto the pixel unit 10, at a timing based on a signal from the timing controller 850. The signal output from the solid-state image sensing element 1000 is input to the video signal processing unit 830, which is a video signal processing unit, and the video signal processing unit 830 performs signal processing in accordance with a method defined by a program or the like. The signal obtained as a result of processing performed by the video signal processing unit 830 is sent as image data to the recording-and-communication unit 840. The recording-and-communication unit 840 sends a signal to be used for formation of an image to the playback-and-display unit 870, and causes the playback-and-display unit 870 to play back and display a moving image or a still image. In addition, upon receiving a signal from the video signal processing unit 830, the recording-and-communication unit 840 communicates with the system controller 860 and also performs an operation for recording the signal to be used for formation of an image in a recording medium, which is not illustrated.

The system controller 860 performs centralized control on operations of the imaging system 800, and controls driving of the optical unit 810, the timing controller 850, the recording-and-communication unit 840, and the playback-and-display unit 870. In addition, the system controller 860 includes a storage device, which is not illustrated and an example of which is a recording medium, and programs and the like necessary to control the operations of the imaging system 800 are recorded in the storage device. In addition, the system controller 860 supplies, inside the imaging system 800, a signal for switching the drive mode or sensitivity of the imaging system 800 in accordance with, for example, an operation of a user. Specific examples include changing of a row to be read out or a row to be reset, changing of a field angle with electronic zooming, shifting of a field angle with an electronic anti-vibration function, and the like. When the sensitivity of the imaging system 800 is switched in accordance with an input of a user, the sensitivity of the solid-state image sensing element 1000 is also switched in accordance with this switching. That is, the system controller 860 has a function serving as a sensitivity selection unit for selecting the sensitivity of the imaging system 800, and the sensitivity of the solid-state image sensing element 1000 is switched in accordance with the selected sensitivity.

The timing controller 850 controls a driving timing of the solid-state image sensing element 1000 and a driving timing of the video signal processing unit 830 in accordance with control performed by the system controller 860. In addition, the timing controller 850 may also function as a sensitivity setting unit that sets an image pickup sensitivity of the solid-state image sensing element 1000.

The above-described embodiments are mere examples and modifications may be made without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156790, filed 31 Jul. 2014, which is hereby incorporated by reference herein in its entirety.

What is claimed is:

1. A solid-state image sensing element comprising:
a pixel array in which a plurality of pixels arranged in two dimensions,
each of the plurality of pixels including:
a photoelectric conversion unit including a pixel electrode, a photoelectric conversion layer provided above the pixel electrode, and a counter electrode provided so as to sandwich the photoelectric conversion layer between the counter electrode and the pixel electrode,
a microlens provided above the photoelectric conversion unit,
a color filter provided between the counter electrode and the microlens, and
a layer provided between the counter electrode and the color filter,
wherein
the plurality of pixels includes a first pixel and a plurality of second pixels,
a light shielding film is provided between the first pixel and one of the plurality of second pixels or between one of the plurality of second pixels and another of the plurality of second pixels,
the layer covers an upper surface of the light shielding film, and
at least either the pixel electrodes of the plurality of second pixels are smaller than the pixel electrode of the first pixel or the counter electrodes of the plurality of second pixels are smaller than the counter electrode of the first pixel,
the first pixel is provided between one second pixel that is provided closest to a first outermost periphery of the pixel array and the first outermost periphery of the pixel array,
another second pixel is provided between the one second pixel and a second outermost periphery of the pixel array, the second outermost periphery being located at an opposite side of the first outermost periphery, and
the another second pixel is adjacent to the one second pixel.

2. The solid-state image sensing element according to claim 1, wherein the plurality of pixels further includes a photoelectric conversion layer separation unit configured to divide the photoelectric conversion layer of two adjacent pixels among the plurality of pixels.

3. The solid-state image sensing element according to claim 2, wherein the photoelectric conversion layer separation unit includes at least one of an insulating member and a light shielding member.

4. The solid-state image sensing element according to claim 1, wherein the photoelectric conversion layer of each of the plurality of second pixels is smaller than the photoelectric conversion layer of the first pixel.

5. The solid-state image sensing element according to claim 4, further comprises a light shielding member provided between the photoelectric conversion layer of a second pixel among the second pixels and the photoelectric conversion layer of a pixel adjacent to the second pixel.

6. The solid-state image sensing element according to claim 1, wherein the photoelectric conversion layer is made of any of intrinsic hydrogenated amorphous silicon, a compound semiconductor, and an organic semiconductor.

7. The solid-state image sensing element according to claim 1,
wherein each of the plurality of pixels further includes a signal readout circuit, wherein
the signal readout circuit includes an in-pixel amplifier, and
the pixel electrode is connected to an input portion of the in-pixel amplifier.

8. The solid-state image sensing element according to claim 1, wherein a configuration between the counter electrode and the microlens of the first pixel is the same as a configuration between the counter electrode and the microlens of each of the plurality of second pixels.

9. The solid-state image sensing element according to claim 1, wherein the light shielding film contacts the counter electrode.

10. The solid-state image sensing element according to claim 1, wherein the light shielding film does not contact the color filter.

11. The solid-state image sensing element according to claim 1, wherein a color of the color filter provided over the plurality of second pixels is green.

12. An imaging system comprising:
the solid-state image sensing element according to claim 1;
an optical system configured to form an image onto the plurality of pixels; and
a video signal processor configured to process a signal output from the solid-state image sensing element and generate image data.

13. A solid-state image sensing element, comprising:
a pixel array in which a plurality of pixels are arranged in two dimensions, each of the plurality of pixels including:
a photoelectric conversion unit including a pixel electrode, a photoelectric conversion layer provided above the pixel electrode, and a counter electrode provided so as to sandwich the photoelectric conversion layer between the counter electrode an the pixel electrode, and
a microlens provided above the photoelectric conversion unit,
wherein the plurality of pixels includes a first pixel and a plurality of second pixels;
the plurality of pixel electrodes of the plurality of second pixels are smaller than the pixel electrode of the first pixel or the counter electrodes of the plurality of second pixels are smaller than the counter electrode of the first pixel, and
the photoelectric conversion layer of each of the plurality of second pixels is smaller than the photoelectric conversion layer of the first pixel,
the first pixel is provided between one second pixel that is provided closest to a first outermost periphery of the pixel array and the first outermost periphery of the pixel array,
another second pixel is provided between the one second pixel and a second outermost periphery of the pixel array, the second outer periphery being located at an opposite side of the first outermost periphery, and
the another second pixel is adjacent to the one second pixel.

14. The solid-state image sensing element according to claim 13, further comprising a light shielding member provided between the photoelectric conversion layer of the second pixel among the plurality of second pixels and the photoelectric conversion layer of a pixel adjacent to the second pixel.

15. The solid-state image sensing element according to claim 13, wherein a configuration between the counter electrode and the microlens of the first pixel is the same as a configuration between the counter electrode and the microlens of each of the plurality of second pixels.

16. The solid-state image sensing element according to claim 13, wherein, in planar view, an area of each of the plurality of pixel electrodes of the plurality of second pixels is smaller than an area of the pixel electrode of the first pixel, or an area of each of the counter electrodes of the plurality of second pixels is smaller than an area of the counter electrode of the first pixel.

17. The solid-state image sensing element according to claim 13, wherein a color of the color filter provided over the plurality of second pixels is green.

18. A solid-state image sensing element comprising:
- a pixel array in which a plurality of pixels arranged in two dimensions, each of the plurality of pixels including:
- a photoelectric conversion unit including a pixel electrode, a photoelectric conversion layer provided above the pixel electrode, and a counter electrode provided so as to sandwich the photoelectric conversion layer between the counter electrode and the pixel electrode,
- a microlens provided above the photoelectric conversion unit, and
- a color filter provided between the counter electrode and the microlens, wherein
- the plurality of pixels includes a first pixel and a plurality of second pixels,
- a light shielding film is provided between the first pixel and one of the plurality of second pixels or between one of the plurality of second pixels and another of the plurality of second pixels, and
- at least either the pixel electrodes of the plurality of second pixels are smaller than the pixel electrode of the first pixel or the counter electrodes of the plurality of second pixels are smaller than the counter electrode of the first pixel, and
- in planar view, the light shielding film does not overlap the pixel electrodes of the plurality of second pixels,
- the first pixel is provided between one second pixel that is provided closest to a first outermost periphery of the pixel array and the first outermost periphery of the pixel array,
- another second pixel is provided between the one second pixel and a second outermost periphery of the pixel array, the second outermost periphery being located at an opposite side of the first outermost periphery, and
- the another second pixel is adjacent to the one second pixel.

19. The solid-state image sensing element according to claim 18, wherein in planar view, the light shielding film does not overlap the pixel electrode of the first pixel.

20. The solid-state image sensing element according to claim 18, wherein a color of the color filter provided over the plurality of second pixels is green.

* * * * *